United States Patent [19]
Guedj

[11] Patent Number: 5,432,746
[45] Date of Patent: Jul. 11, 1995

[54] EEPROM MEMORY ORGANIZED IN PLURAL BIT WORDS

[75] Inventor: Marc Guedj, Aix En Provence, France

[73] Assignee: SGS-Thomson Microelectronics S.A., Gentilly, France

[21] Appl. No.: 163,864

[22] Filed: Dec. 8, 1993

[30] Foreign Application Priority Data

Dec. 9, 1992 [FR] France .................. 92 14856

[51] Int. Cl.⁶ .............................................. G11C 7/00
[52] U.S. Cl. ..................... 365/202; 365/207; 365/208; 365/210; 327/52
[58] Field of Search ............ 365/202, 207, 208, 210; 307/530, 494

[56] References Cited

U.S. PATENT DOCUMENTS 5,321,660  6/1994  Sani et al. ............... 365/210

FOREIGN PATENT DOCUMENTS 0264933  4/1988  European Pat. Off.
0412837  2/1991  European Pat. Off.
2600808  12/1987  France.

OTHER PUBLICATIONS

IEEE Journal of Solid–State Circuits, vol. 23, No. 5, Oct. 1988 New York, U.S., pp. 1150–1156, Gastaldi et al 'A 1-Mbit CMOS EPROM with Enhanced Verification'.

Primary Examiner—Joseph A. Popek
Assistant Examiner—F. Niranjan
Attorney, Agent, or Firm—Wolf, Greenfield & Sacks

[57] ABSTRACT

The invention relates to integrated circuit memories and more particularly to non-volatile memories of the EEPROM type. The memory is organized in p-bit words (p>1) with p-read circuits operating in a differential way with respect to a reference line. The memory operates with a balancing phase of the bit line and of the reference line prior to the actual read phase. The reference line is common to the p-read circuits and, for this purpose, a balancing circuit is provided in the read circuits, which acts without shorting the bit line and the reference line. Such circuit includes a follower amplifier in a feedback loop arrangement. The follower amplifier changes the bit line potential in a direction tending to null the output of a differential amplifier used for reading the memory cell state.

17 Claims, 2 Drawing Sheets

EEPROM MEMORY ORGANIZED IN PLURAL BIT WORDS

BACKGROUND OF THE INVENTION

1. Field of the Invention

The invention relates to memories and, more particularly, to electrically programmable and electrically erasable non-volatile memories, though it may also apply by extension to other types of memories, either volatile or non-volatile memories.

2. Discussion of the Related Art

The electrically programmable and erasable non-volatile memories, more commonly known as EEPROM memories, are memories currently organized in 1-bit words and not in plural bit words. The reason for that organization is that they are low-capacity memories (a few thousands of bits), often associated with sequential binary information processing circuits. If such memories are used in an application requiring plural bit words, then several parallel memory chips are used, which receive the same addresses and each deliver (or receive) a respective bit of the stored word (or of the word to be stored).

Owing to the technological development in the field of information processing, there is a growing need for higher capacity EEPROM memories (64 kilobits and more). Memories organized in 1-bit words and including a greater number of addresses can still be used. Yet, this gives rise to two types of drawbacks: first, such an organization is somewhat unsuited to the parallel signal processing of plural bit words; and second, regarding the programming is comparatively slow and it is prohibitively time-consuming if not carried out in groups of several bits.

Efforts are therefore devoted to the development of new memories, and especially EEPROM memories, organized in p-bit words ($p > 1$) and with p inputs/outputs to receive words to be stored in a given location or to deliver words stored in that location. One of the problems then encountered is that of reading the stored words. One of the limitations is that of access speed; a stored word is wanted out of the memory as quickly as possible (and of course without this rate giving rise to read errors or to transmission errors in the extracted information). The desired read speed ranges from a few tens to some hundreds of nanoseconds per word. In order to reach such speeds, without running the risk of losing the information to be read, precautionary measures must be taken both for the general organization of the memory cell array and for the read mode.

With regard to the general organization of the array, in rows and columns, it is well known that the rows and columns should preferably not be too long. For example, the access time to a memory cell located at a row end far from the row decoder would be longer (by several tens of nanoseconds for a rather long row) than the access time to a cell located at another row end near the decoder. Additionally, too long columns introduce a high stray column capacitance, which slows down the information read time.

In order to avoid too long columns, measures are therefore taken to distribute the words in the memory in such a way that several words are present in each row. The memory map is thus made more compact. It results in both a row decoder for addressing a row among n locations and a column decoder for addressing a word among m locations in a line of m words of p bits.

Moreover, instead of arranging the row decoder on a memory edge, it has already been suggested to arrange the row decoder in the center of the memory, between two half-planes, symmetrical about the decoder. The memory may even be divided into four planes or more, with several half-decoders.

With regard to the read method, it is generally executed in a differential way. The state of a bit line (that is the lead on which the requested information appears) is determined in comparison with the state of a reference line which behaves like a bit line, whose transmitted information is known. In the case of an EEPROM memory, for example, the requested information is a leakage current, flowing or not flowing in the bit line depending on the information stored in the addressed cell. Such current is compared with a current flowing in the reference line. This differential method permits a fair reliability of the read information.

Moreover, so as to improve the compromise between the access speed and the reliability of a given piece of information, it has also been suggested to carry out the read operation in two phases. In the first phase, the bit line and the reference line are precharged to a potential value, which is intermediate between two possible extreme values, and, in the second phase, the behaviors of the bit line and reference line are compared with one another.

Last, and still with the same object in view, it has been suggested to provide for a balancing phase at the differential amplifier, which is to be used for comparing the behaviors of the bit line and reference line. This balancing phase generally consists in shorting the bit line and the reference line (or the differential amplifier inputs connected to such lines). In this way, the differential amplifier will be able to switch over very quickly to one state or another depending on the read information, irrespective of the state to which it had switched over on the preceding read operation.

In fact, if the amplifier initially kept the state to which it had switched over for the preceding read operation, it would take it a longer time to read a bit having the same value as before than it would take to read a bit having a complementary value, which would be detrimental to the overall operating speed of the memory.

For all of the above reasons, the memories now available may present an organization with n rows of m words of p bits, possibly with a central row decoder, rather than a side decoder, and a read method possibly including precharging and balancing phases.

It is an object of the present invention to further improve the compromises controlling the memory design, and more particularly that of EEPROM memories with plural bit words. Besides the above mentioned compromises regarding reliability and speed, the conventional limitations must be taken into account, such as, for instance, the minimization of the physical area occupied by the memory on an integrated circuit chip.

SUMMARY OF THE INVENTION

According to the present invention, there is provided a memory organized in p-bit words ($p > 1$), with p-bit lines for connecting each one of the p cells of a word to be read to a first input of a read circuit having a second input connected to a reference line, the read circuit including a differential amplifier, the memory including a respective balancing circuit for each read circuit, the balancing circuit being intended to tend to null during a balancing phase preceding a read phase, the output voltage of the associated differential amplifier, wherein the reference line is common to the p-read circuits, and the balancing circuits have means to tend to null the output voltage of the associated differential amplifier, without shorting a bit line and the reference line (i.e. without any current flowing between the bit line and the reference line at the time of balancing).

In the prior art, the balancing circuits operated mainly by shorting the bit line and the reference line (or, by extension, by shorting both inputs of the differential amplifier used to compare the behaviors of the bit line and reference line), which in practice, meant that there were as many reference lines as bits in the word to be read, i.e. as many reference lines as there were differential read amplifiers. The present invention, by contrast, provides one reference line only, and a balancing circuit which does not connect a bit line with the reference line, and above all which does not short it, so as not to give rise to a general short-circuit condition between the bit lines; such a general short-circuit would in fact preclude an actual individualized balancing according to the characteristics of every bit line and every differential amplifier.

Such a balancing circuit preferably works by creating a feedback path between the differential amplifier output and the associated bit line, such feedback path being so arranged to modify the bit line potential in a direction tending to null the amplifier output voltage. The balancing circuit preferably includes a follower amplifier having an input connected to the differential amplifier output and being connected during the balancing phase in such a way that it injects a bit line charging current in a direction tending to null the amplifier output voltage.

In a particular configuration, a first precharge transistor is connected to the bit line while a second precharge transistor is connected to the reference line, the follower amplifier output being connected, during the balancing phase, to the first precharge transistor. The other end of the first precharge transistor is connected to the first input of the differential amplifier while the other end of the second precharge transistor is connected to the second input of the differential amplifier. The gates of the precharge transistors are preferably connected to a reference potential.

More particularly, and especially in the case of an EEPROM memory, the bit line and the reference line are preferably connected to a current comparison circuit for comparing, during the read phase, the discharge current of the bit line to that of the reference line. Such a comparison circuit preferably includes a reference transistor connected to the reference line through the second precharge transistor, and a transistor duplicating the reference transistor current, the duplication transistor being connected to the bit line through the first precharge transistor.

In an embodiment, a first intermediate transistor, whose gate is connected to a fixed potential, is series-connected between the duplication transistor and the first precharge transistor.

Similarly, a second intermediate transistor, whose gate is connected to the same fixed potential as the first intermediate transistor, is series-connected between the reference transistor and the second precharge transistor.

BRIEF DESCRIPTION OF THE DRAWINGS

The foregoing and other features and advantages of the invention will become more readily apparent from the following detailed description taken in conjunction with the accompanying drawings, in which.

DETAILED DESCRIPTION

Figure 1:
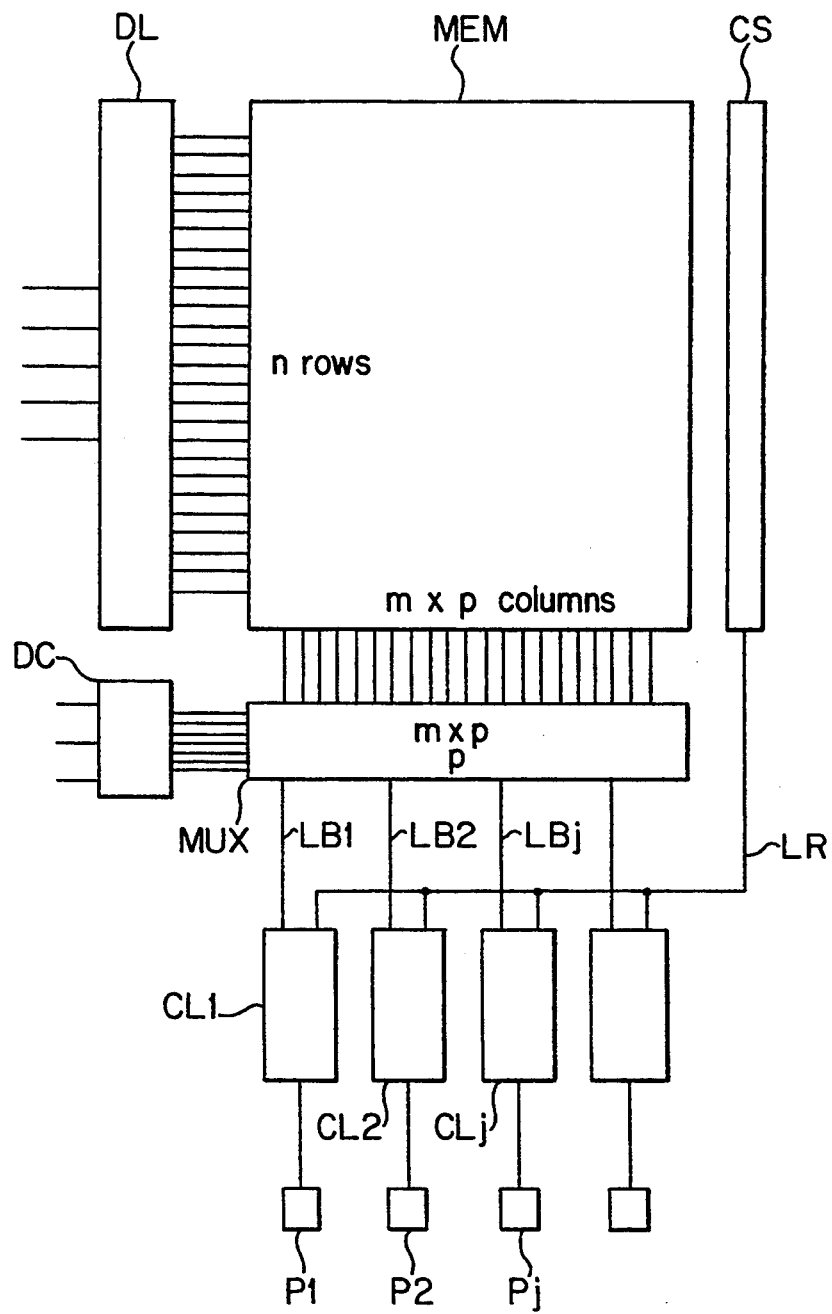
FIG. 1 shows, in a block diagram form, the overall configuration of a memory according to the invention.

FIG. 1 illustrates a MEM memory, organized in n rows of m words of p bits. It therefore includes:

an array of n rows of mp memory cells, with n-row leads, each one being associated to a cell row for selecting the cells in this row, and mp column leads for transmitting to the memory output the data stored in the cells of the selectioned row;

a row decoder DL for selecting a given row among n rows;

a column decoder DC for controlling a multiplexer MUX and selecting through such multiplexer MUX one group of p-column leads among the mp column leads;

p-bit lines LB1, LB2, etc., connected through said multiplexer MUX to the selected group of p columns; and, p-read circuits CL1, CL2, etc., each having a first input connected to a bit line and a second input connected to a reference line LR; wherein each read circuit performs a comparison between the bit line behavior and the reference line behavior and the delivery of an output signal representative of an information bit stored at the intersection of the row and selected column; this output signal is applied, for instance, to a respective data pad P1, P2, etc. of the integrated circuit chip on which the memory is present.

The reference line LR is, according to the invention, common to the p-read circuits. It is preferably a column lead connected to an additional column CS of memory cells; such additional column is arranged beside the other memory columns and it can be addressed by the same row decoder DL as the other cells, which makes the reference line look as much as possible like a memory bit line. But the cells of the reference line are all in the same known state (for instance, all of them are blank cells, that is they have never been programmed).

The other circuits are conventional as understood by those skilled in the art and will therefore not be described. Besides, for clarity of explanation, the write circuitry, which is conventional too, is not illustrated in FIG. 1. Additionally, FIG. 1 shows the case of a memory with a row decoder arranged by the side of the cell array but it should be appreciated that the invention can also apply to memories divided into two half-planes with the decoder therebetween.

Figure 2:
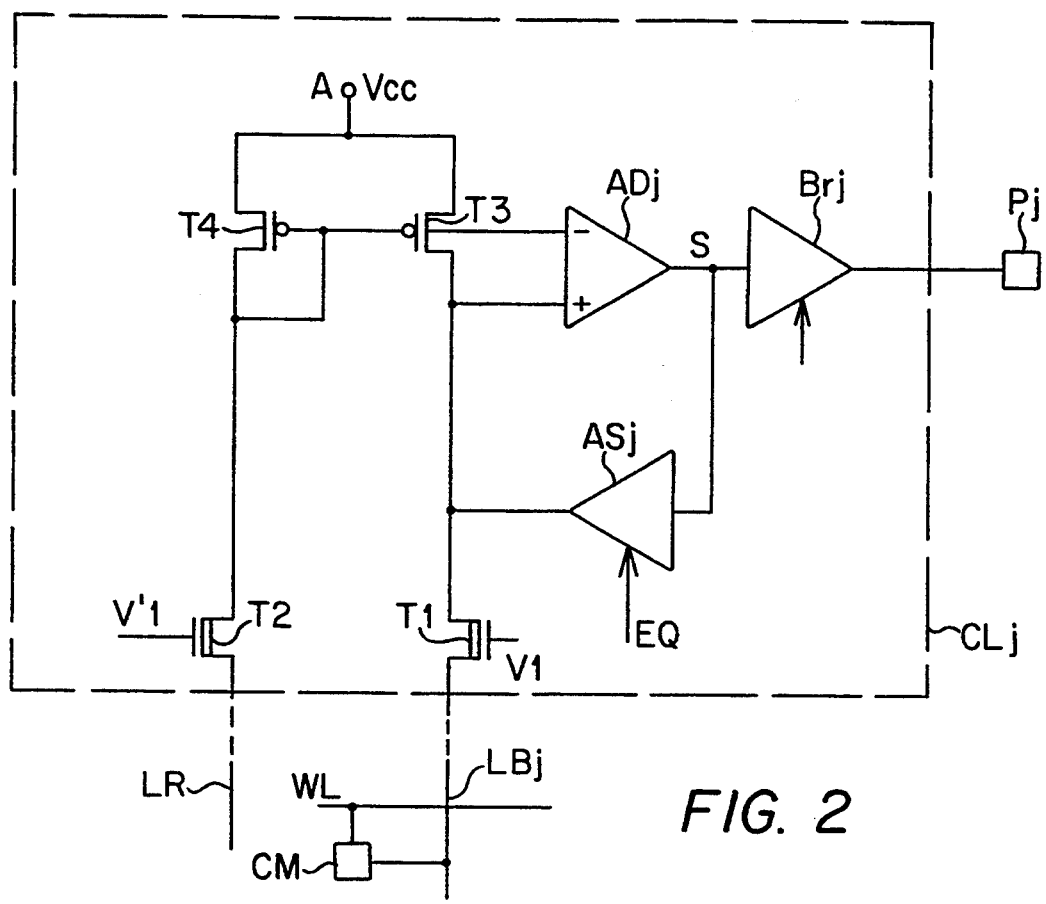
FIG. 2 shows, in a schematic diagram form, an embodiment of a read circuit of the memory.

A read circuit CLj associated with a given bit line LBj is shown in FIG. 2, in the case of an EEPROM memory; the circuit is identical for all bit lines but the reference line is the same one for the p-read circuits.

With respect to an EEPROM memory, the memory cells can have a programmed state in which they permit an electric current to flow, an erased state in which they oppose the flow of current and a blank state in which they permit an intermediate current to flow; in order to read the information, the presence of a charging or of a discharge current of the bit line connected to a cell to be read has to be detected. Such a current exists if the cell is programmed, whereas there is no such current if the cell is erased.

The read operation consists of comparing the bit line current to that which would flow in a blank cell. The comparison result indicates whether the read cell is erased or programmed. To this end, the reference line connected to a column of blank cells is used, and the bit line current is directly compared with the reference line current. A differential amplifier ADj gives the comparison result (See FIG. 2).

The read circuit preferably operates with a bit line and reference line precharging phase, prior to an actual read phase. The reference line and bit line are precharged to a potential of about 1.9 volt (for a supply voltage Vcc of about 5 volts for the memory).

The read circuit includes for this purpose a first precharge transistor T1 which serves to supply the bit line LBj with a precharge current, while limiting its precharge potential to a determined value, preferably around 1.9 volts. A second precharge transistor T2 precharges in the same way the reference line LR.

Both transistors T1 and T2 are preferably N-channel transistors with a low threshold voltage (0.2 volt for instance), their sources being connected to the line to be precharged so as to make things clearer, the transistor T1 and T2 gates are shown as being connected to polarization voltage sources V1 and V'1 respectively. The value of voltage V1 determines the upper limit of the precharge potential for lines LBj and LR.

The transistors Ti and T2 have their drains fed by the two branches of a current mirror having a duplication ratio k equal to 1. The first mirror branch comprises a duplication transistor T3; the second branch comprises a reference transistor T4. The duplication transistor tends to duplicate the current flowing in the reference transistor.

The duplication transistor T3 is preferably a P-channel transistor whose source is connected to the high supply voltage terminal (terminal A at Vcc) of the circuit; it is generally set at about +5 volts above a low supply terminal. The duplication transistor drain is connected to the drain of the first precharge transistor T1.

The reference transistor T4 is preferably similarly a P-channel transistor, having a geometry similar to T3, and having its source connected to terminal A and its drain connected to the drain of the second precharge transistor T2.

The gates of transistors T3 and T4 are linked to one another and the reference transistor T4 gate is connected to its drain (diode-connected transistor). It thus results in a conventional current duplication arrangement.

The differential amplifier ADj is connected through its inputs to the drains of transistors T3 and T4 and it measures the potential differences between these two drains. This difference is zero if the currents flowing through T3 and T4 are equal. The difference is not equal to zero if the current ratio is other than 1. The output of the amplifier ADj delivers a signal indicating whether the current ratio is greater or lower than 1, and therefore indicating whether the bit line LBj is connected to a programmed or to an erased cell CM.

Prior to executing a read phase, a balancing phase is first carried out on the bit line and on the reference line. Through such a balancing phase, the differential voltage deviation at the input of amplifier ADj has a value as near as possible to zero whatever the logic state read in a memory cell on the preceding read phase may be. In the prior art, this balancing phase consisted of shorting, by means of a transistor in the on-state during the balancing phase, both differential amplifier inputs, which amounts to connecting or practically shorting the bit line and the reference line. This solution was compatible with a 1-bit word memory architecture or with plural bit word memory architectures, but then with as many reference lines as there were bit lines.

According to the invention, a balancing circuit is used, which does not connect the bit line and the reference line through conducting devices, which results in one reference line only for all the read circuits.

The balancing circuit CLj associated with the bit line LBj mainly includes a follower amplifier ASj whose input is connected to the output S of the differential amplifier ADj, and whose output is connected to the drain of one of the precharge transistors, preferably to transistor T1 which is connected to the bit line corresponding to the cell to be read.

This follower amplifier ASj is only activated during a balancing phase EQ preceding the read phase LCT. During the other phases, i.e. more particularly during the read phase, its output acts like a high impedance, so as not to either take current from or inject current into the first current mirror branch. A follower amplifier activation unit receives a clock signal determining the balancing phase EQ.

This follower amplifier is the main element of a feedback loop which changes the bit line precharge in order to raise or to reduce the potential of one input of the differential amplifier ADj, in a direction tending to null the differential amplifier output voltage.

It may be assumed that the activation of such follower amplifier ASj acts like a complementary precharge, with the result that two separate phases (precharging and balancing) need not necessarily be provided for prior to the read phase; a single balancing phase may suffice since it acts in the same way as a precharging phase, while taking charge of the balancing function. This is the reason why the control gates of T1 and T2 are represented as being controlled by a fixed polarization potential V1, V'1 and not by a circuit which would be energized during a precharging phase. Transistors T1 and T2 act, as shown in FIG. 2, as voltage limiters so as to limit the precharge voltage of both the bit line and the reference line around 1.9 volt.

The circuit operation is as follows. During the precharging phase, the bit line and the reference line are raised to a potential of about 1 volt. The value of voltage V1 applied during the precharging-process controls this potential value. Then, during the balancing phase, the follower amplifier ASj is activated and it changes the bit line load according to the differential amplifier output state. The bit line load change tends to zero the output of amplifier ADj. The differential amplifier is thus balanced just before the read phase. The amplifier output then delivers an almost zero voltage whatever the logic state of this output on the preceding read operation may have been.

During the read phase, the follower amplifier is deactivated (high impedance output). The applying of a read voltage to the word line has two possible effects (See FIG. 3):

If the read cell is programmed, then it tends to discharge the bit line with a current Ip. But the current mirror imposes a current Ir (wherein Ir is lower than Ip) in the bit line, since a current Ir simultaneously flows in the reference line connected to a blank cell.

The drain of transistor T1 tends to drop to a zero potential whereas the drain of transistor T2 remains at about a threshold voltage below the supply voltage Vcc. The differential amplifier ADj switches over to a first state; or If the read cell is erased, the discharge current of the bit line will not be let through, whereas the duplication transistor T3 tends to impose a discharge current Ir; transistor T3 becomes saturated and tends to raise the drain potential of transistor T1 to Vcc. The differential amplifier AD switches over to the other direction. A buffer amplifier, BFj, which is activated during the read phase LCT, passes to a pad Pj the output state of the differential amplifier ADj.

Figure 3:
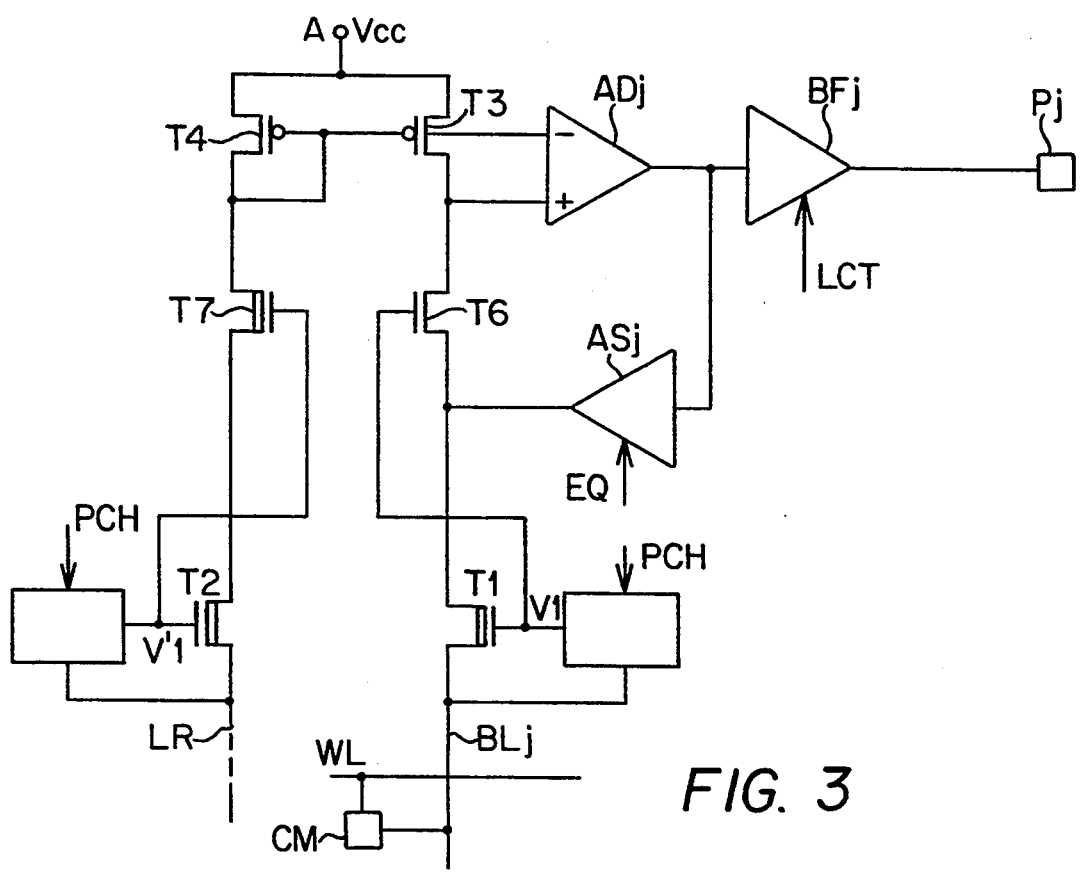
FIG. 3 shows, in a schematic diagram form, a modified embodiment of the read circuit.

In an improved embodiment, shown in FIG. 3, an additional transistor T6 is connected between the drain of precharge transistor T1 and the drain of duplication transistor T3; and, similarly, a transistor T7 is connected between the drain of precharge transistor T2 and the drain of reference transistor T4. The inputs of the differential amplifier ADj are connected to the drains of transistors T3 and T4 of the current mirror, as shown in FIG. 2.

Those transistors T6 and T7 are cascaded, i.e. their gates are at a constant potential which forces them to the conducting state. They are preferably N-channel transistors having a very low threshold voltage (0.2 volts), the gates of transistors T1 and T2 being connected to potential V1 and to potential V'1 respectively. The output of follower amplifier ASj is connected to the junction point of the precharge transistor T1 and of the additional transistor T6.

The advantage of such transistors lies in the fact that they lead in a high resistive impedance dynamically between the bit line and the differential amplifier inputs. Such an impedance results in a decoupling between the drain of transistor Ti (having a high stray capacitance owing to the presence of the follower amplifier) and the input of the differential amplifier (having a low stray capacitance).

It follows from this that the voltage imbalance which appears on the bit line during the read phase passes, strongly amplified, across the differential amplifier. The read operation is therefore speeded up. Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

I claim:

1. An integrated circuit memory comprising:
    a memory cell array storing P bit words wherein $P > 1$;
    P bit lines coupled to the memory cell array to communicate the stored words;
    a reference line to which the bit lines are compared; and
    P read circuits, each read circuit having first and second inputs, the first input of each read circuit coupled to a respective bit line and the second input of each read circuit coupled to the reference line, each read circuit further including:
        a differential amplifier, coupled to the respective bit line and the reference line, comparing information on the respective bit line with information on the reference line during a reading phase and providing an output; and
        a balancing circuit, coupled to the differential amplifier, forcing the output of the differential amplifier substantially to zero during a balancing phase preceding the reading phase,
        wherein the balancing circuit includes a feedback path coupled between the output of the differential amplifier and the respective bit line.

2. An integrated circuit memory according to claim 1 wherein the balancing circuit further includes a follower amplifier having an input coupled to the differential amplifier output, the follower amplifier injecting a bit line charging current during the balancing phase such that the amplifier output tends substantially to zero.

3. An integrated circuit memory according to claim 2 wherein each read circuit further includes a first precharge transistor coupled to the respective bit line and a second precharge transistor coupled to the reference line.

4. An integrated circuit memory according to claim 3 wherein the follower amplifer has an output coupled to the first precharge transistor during the balancing phase.

5. An integrated circuit memory according to claim 4 wherein each precharge transistor has a gate terminal coupled to a reference potential during a precharging phase.

6. An integrated circuit memory according to claim 4 further comprising current comparison means, coupled to the respective bit line and reference line, for comparing, during the reading phase, a discharge current in the respective bit line with a discharge current in the reference line.

7. An integrated circuit memory according to claim 6 wherein the comparison means includes a reference transistor coupled to the reference line through the second precharge transistor and a duplicating transistor, coupled to the reference transistor and to the respective bit line, substantially duplicating current in the reference transistor.

8. An integrated circuit memory according to claim 7 wherein the first precharge transistor is coupled to a first input of the differential amplifier and the second precharge transistor is coupled to a second input of the differential amplifier.

9. An integrated circuit memory according to claim 7 further including a first intermediate transistor coupled between the duplication transistor and the first precharge transistor and having a gate terminal coupled to a fixed potential.

10. An integrated circuit memory according to claim 9 wherein the first intermediate transistor includes an N-channel transistor.

11. An integrated circuit memory according to claim 10 wherein the gate of the first intermediate transistor is connected to the gate of the first precharge transistor.

12. An integrated circuit memory according to claim 10 further including a second intermediate transistor coupled between the reference transistor and the second precharge transistor and having a gate terminal coupled to the gate of the second precharge transistor.

13. An integrated circuit memory comprising:
a memory cell array storing information;
a first plurality of bit lines coupled to the memory cell array to communicate the stored information;
a reference line to which the bit lines are compared; and
a second plurality of read circuits, each read circuit having first and second inputs, the first input of each read circuit coupled to a respective bit line and the second input of each read circuit coupled to the reference line, each read circuit further including:
   a differential amplifier, coupled to the respective bit line and the reference line, comparing information on respective bit line with information on the reference line during a reading phase, and providing an output; and
   a balancing circuit, coupled to the differential amplifier, forcing the output of the differential amplifier substantially to zero during a balancing phase proceeding the reading phase,
   wherein the balancing circuit includes a feedback path coupled between the output of the differential amplifier and the resepctive bit line.

14. An integrated circuit memory according to claim 13 wherein the balancing circuit further includes a follower amplifier having an input coupled to the differential amplifier output, the follower amplifier injecting a bit line charging current during the balancing phase such that the amplifier output tends substantially to zero.

15. An integrated circuit memory according to claim 14 wherein each circuit further includes a first precharge transistor coupled to the respective bit line and a second precharge transistor coupled to the reference line.

16. An integrated circuit memory according to claim 15 further including a reference transistor coupled to the reference line through the second precharge transistor, and a duplicating transistor, coupled to the reference transistor and to the bit line through the first precharge transistor, substantially duplicating current in the reference transistor.

17. A method for determining information stored in an integrated circuit memory comprising the steps of:
storing information in a memory cell array;
communicating, through a plurality of bit lines coupled to the memory cell array, the information stored in the memory cell array; and
comparing information on each bit line with information on a reference line during a reading phase, the step of comparing information including the step of using a differential amplifier coupled to a bit line and the reference line, to compare information on the bit line with the information on the reference line, and further including the step of forcing an output of the differential amplifier substantially to zero during the balancing phase proceeding the reading phase.

* * * * *

UNITED STATES PATENT AND TRADEMARK OFFICE
CERTIFICATE OF CORRECTION

PATENT NO. :  5,432,746
DATED       :  July 11, 1995
INVENTOR(S):  Marc GUEDJ

It is certified that error appears in the above-identified patent and that said Letters Patent is hereby corrected as shown below:

In column 6, line 62 before "output" insert -differential-; before "voltage" insert -differential-.

In claim 1, line 17 change "an" to -a differential-; line 19, before "output" insert -differential-.

In claim 13, line 17 change "an" to -a differential-; line 19, before "output" insert -differential-; and line 23, before "output" insert -differential-.

In claim 17, line 13 change "an" to -a differential-.

Signed and Sealed this

Twenty-fourth Day of June, 1997

Attest:

BRUCE LEHMAN

*Attesting Officer*     *Commissioner of Patents and Trademarks*